United States Patent
Woolsey et al.

(10) Patent No.: US 7,204,371 B2
(45) Date of Patent: Apr. 17, 2007

(54) SELECTABLE KEYING DEVICE

(75) Inventors: Terrill L. Woolsey, Wichita, KS (US); Tina M. Reintjes, Wichita, KS (US)

(73) Assignee: LSI Logic Corporation, Milpitas, CA (US)

( * ) Notice: Subject to any disclaimer, the term of this patent is extended or adjusted under 35 U.S.C. 154(b) by 384 days.

(21) Appl. No.: 10/191,219

(22) Filed: Jul. 9, 2002

(65) Prior Publication Data

US 2004/0038568 A1    Feb. 26, 2004

(51) Int. Cl.
  *A47F 7/00* (2006.01)
(52) U.S. Cl. ........................................ 211/26
(58) Field of Classification Search ........... 211/26, 211/192, 187, 189, 175, 190, 191; 439/135; 361/863; 248/287.1
  See application file for complete search history.

(56) References Cited

U.S. PATENT DOCUMENTS

| | | | | |
|---|---|---|---|---|
| 3,392,848 A | * | 7/1968 | McConnell et al. | 211/192 |
| 3,986,318 A | * | 10/1976 | McConnell | 403/384 |
| 4,955,743 A | * | 9/1990 | King | 403/254 |
| 5,485,932 A | * | 1/1996 | Romm et al. | 211/87.01 |
| 5,791,498 A | * | 8/1998 | Mills | 211/26 |
| 6,223,908 B1 | * | 5/2001 | Kurtsman | 211/26 |
| 6,622,873 B2 | * | 9/2003 | Hegrenes et al. | 211/26 |
| 6,626,407 B1 | * | 9/2003 | Miller et al. | 248/250 |
| 6,788,531 B2 | * | 9/2004 | Chen | 361/683 |
| 6,866,154 B2 | * | 3/2005 | Hartman et al. | 211/26 |

* cited by examiner

*Primary Examiner*—Jennifer E. Novosad
(74) *Attorney, Agent, or Firm*—Suiter Swantz PC

(57) ABSTRACT

A method and system for controlling electronic component configuration. The system includes a guard including an aperture and a plate including an aperture are adjustably connected. The guard and the plate each include a pin connected thereto. The system is capable of adjusting configurations to obtain an open configuration where at least a portion of the guard and plate apertures align and a blocked configuration where the plate and the guard apertures fail to permit access. Depending on an introduced component characteristic the component's physical keying structure may be received or prevented depending on the implementation. Additionally the present invention permits retrofitting a component with a correct characteristic but lacking a keying structure by disposing plate/guard pins outside the footprint of an introduced electronic component.

14 Claims, 4 Drawing Sheets

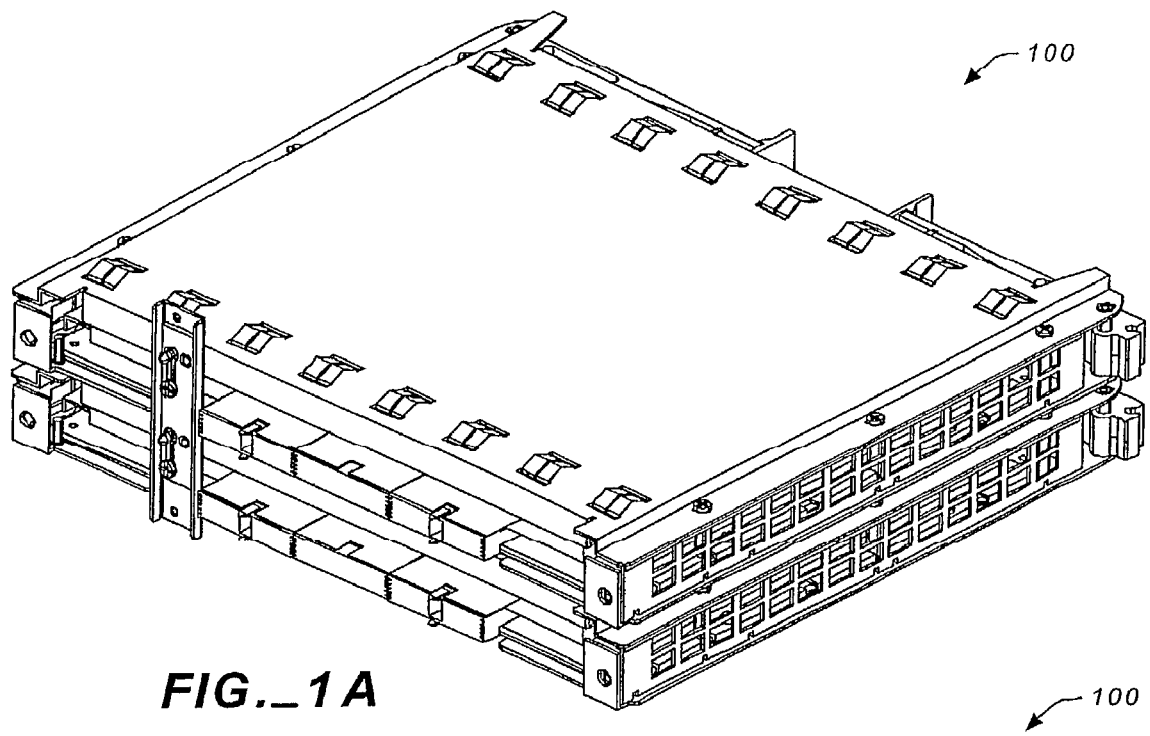
*FIG._1A*
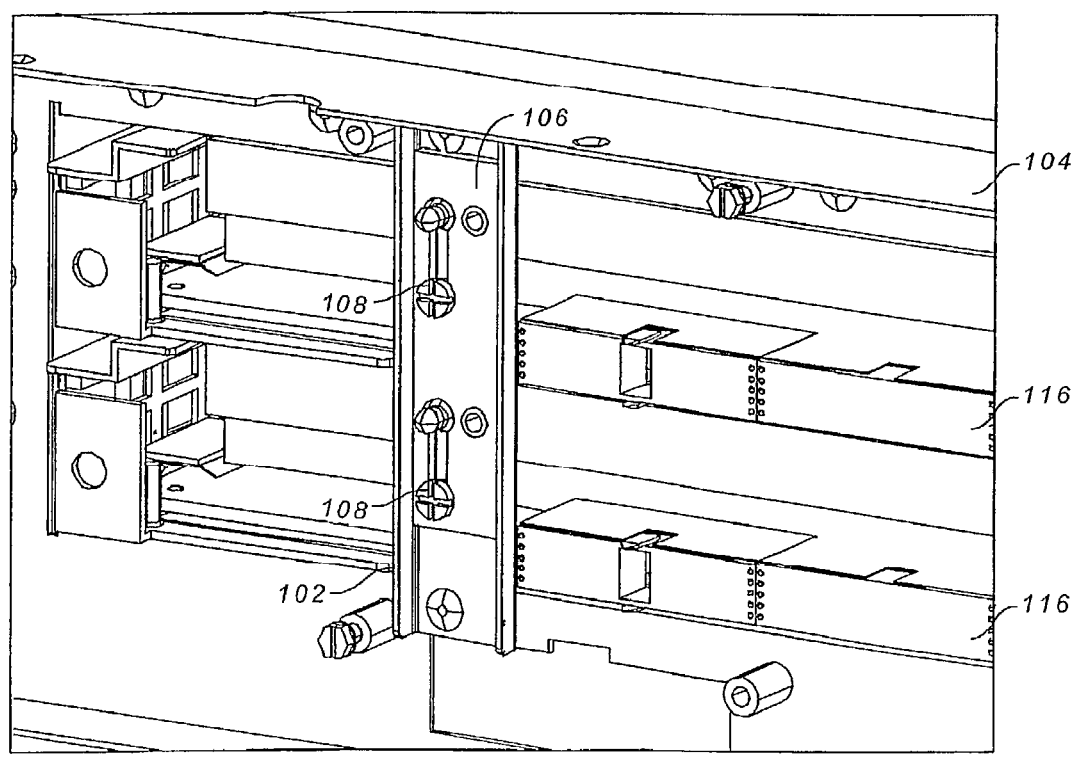
*FIG._1B*

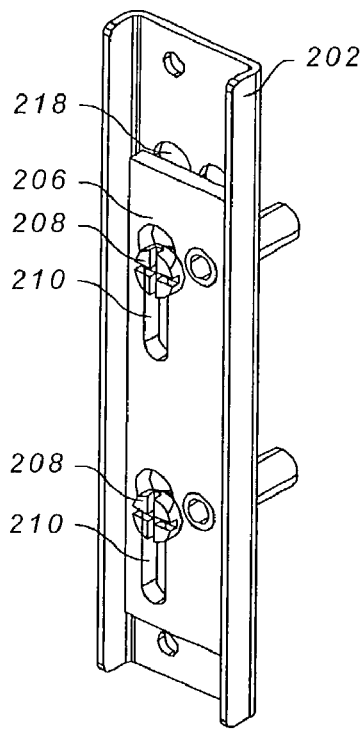
FIG._2A
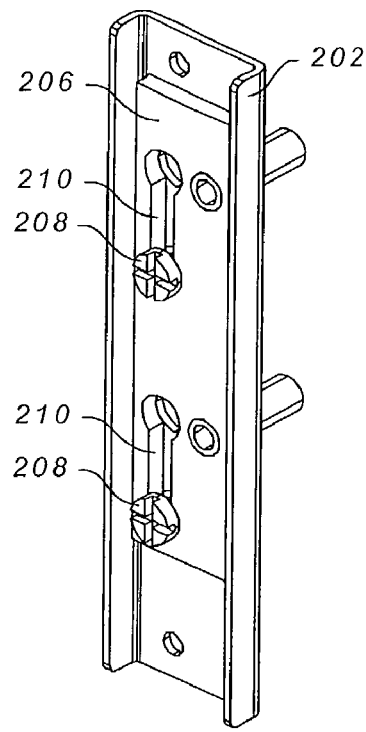
FIG._2C
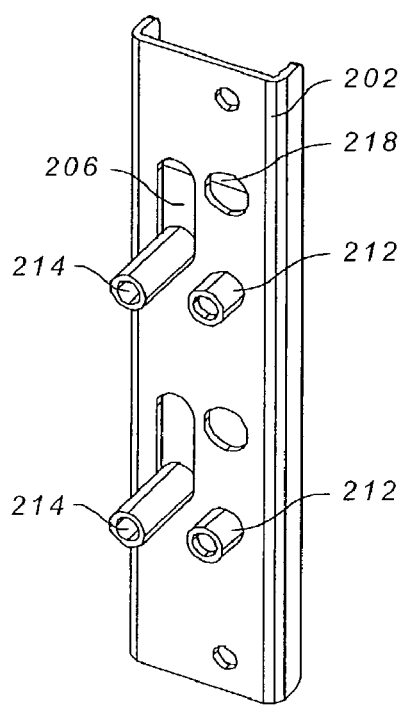
FIG._2B
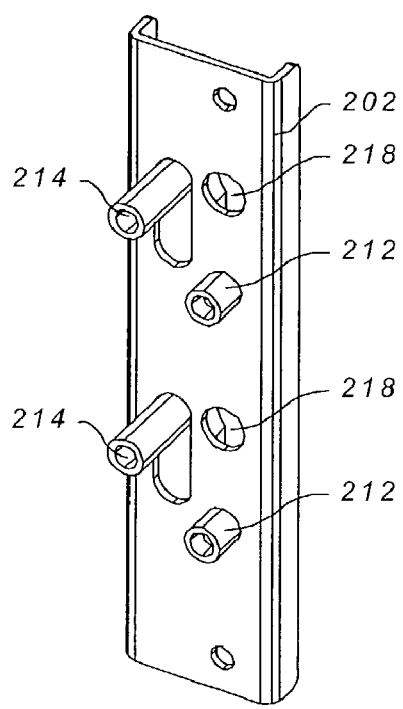
FIG._2D

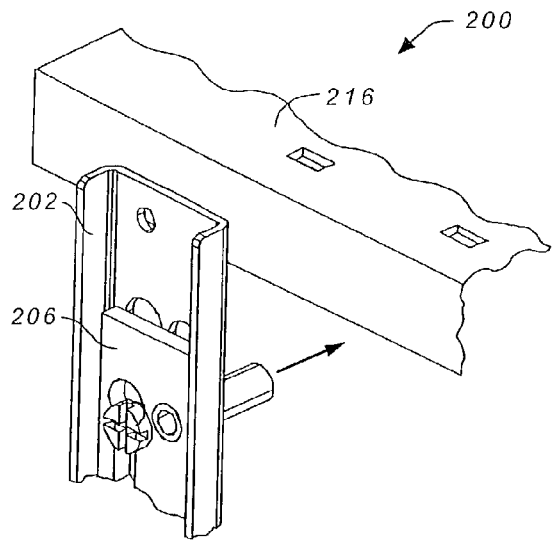
FIG._3A
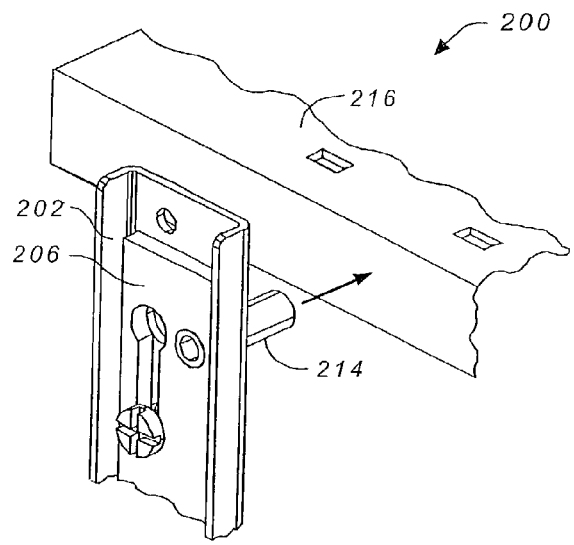
FIG._3C
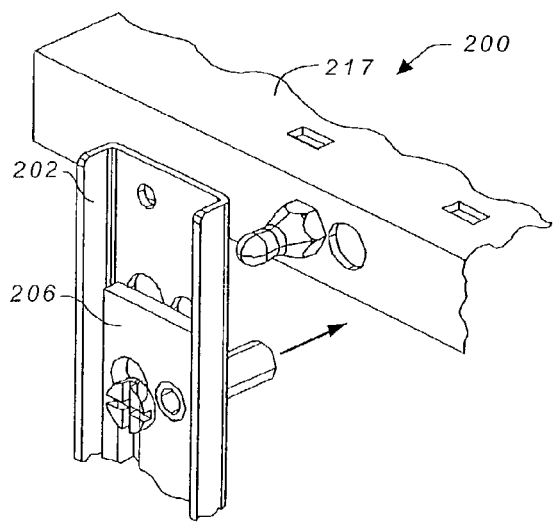
FIG._3B
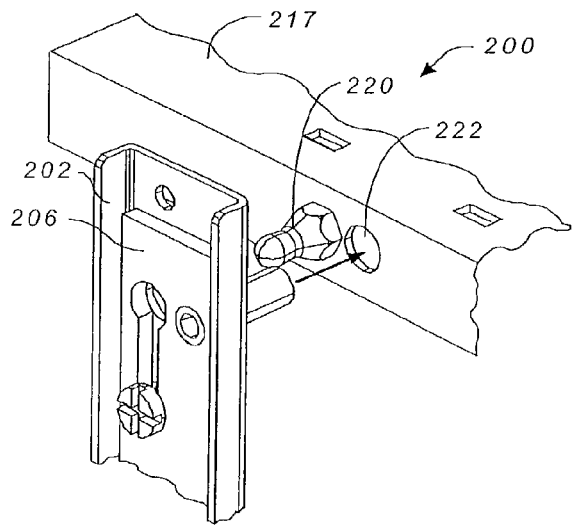
FIG._3D

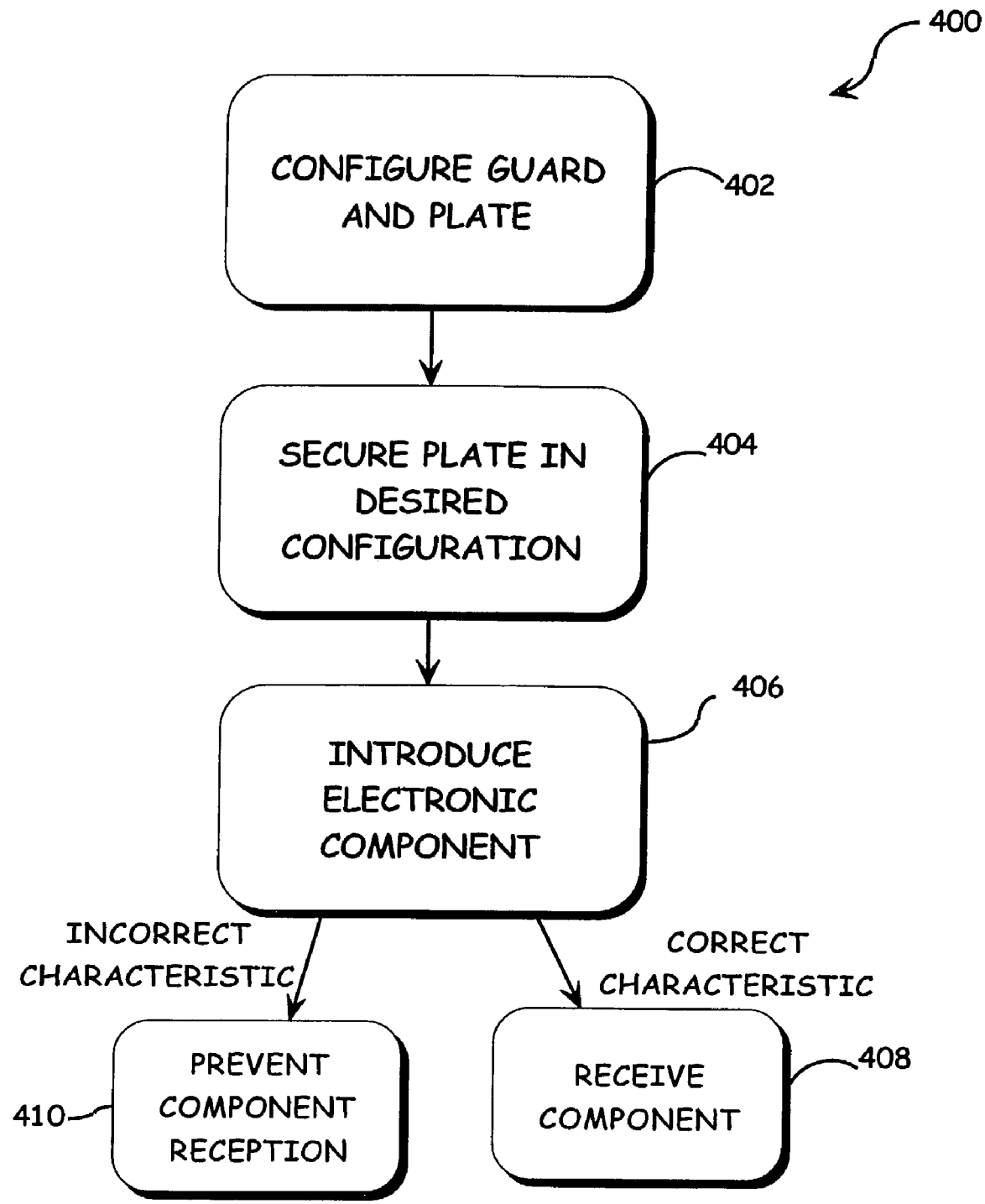
FIG._4

SELECTABLE KEYING DEVICE

FIELD OF THE INVENTION

The present invention relates to the field of electronics, and particularly to a method and system for controlling the physical connection of electronic components.

BACKGROUND OF THE INVENTION

Electronics and in particular electronics associated with data handling, such as data storage, are important in a technological society. Electronic devices, including data storage system, servers and the like, typically employ housings which permit users to alter device components to achieve additional functionality and replace failed components.

For example, a data storage system user may wish to update or replace a storage controller in a particular housing. Current housing systems fail to prevent incompatible components integration while retaining flexibility. In another example, a housing implementing current lockout systems may limit users unnecessarily, such as by blocking compatible components. Incompatible component integration is complex because categories of electronic devices typically utilize similar electronic connections. A drawback to common electronic connections is that all devices with the connection can mate even if the devices are incompatible.

Faced with incompatibility issues, electronic device manufactures either choose to incorporate lockout systems preventing incompatible component integration, or manufacture devices without lockout systems. Devices manufactured with current lockout systems prohibit retrofitting. For example, a housing equipped with a lockout system may prevent a previously manufactured compatible component from mating, thereby limiting user to components having the lockout system. Additionally, manufacturers typically do not want to manufacture multiple component housings, to accommodate systems with and without lockouts due to manufacturing and expense.

Alternatively, electronic devices without lockout system risk incompatible components connection, data loss and even physical damage. Furthermore, a device without lockout requires user sophistication to recognize incompatibility issues.

Therefore, it would be desirable to provide a method and system for providing selectable keying, while permitting retrofitting with compatible electronic components.

SUMMARY OF THE INVENTION

Accordingly, the present invention is directed to a method and system for controlling electronic component configuration. The system of the present invention furthermore permits the retrofitting of electronic devices having a correct characteristic, such as compatibility.

The system of the present invention includes a guard suitable for attaching to a chassis. The guard includes an aperture and a pin connected thereto. A plate including an aperture and a pin connected thereto is adjustably connected to the guard such that the plate is capable of achieving an open configuration and a blocked configuration corresponding to the alignment of at least a portion of the plate aperture with the guard aperture. A securing mechanism connects the plate and guard in the desired configuration. An electronic component with a characteristic is introduced. The component may be received and properly seated or prohibited depending on the components physical structure, such as the configuration of keying structures (pins/apertures) or lack thereof in the case of a retrofit.

The method of the present invention includes configuring a guard including an aperture and a plate including an aperture, each of the guard and the plate have a pin connected thereto. The guard and plate are secured once the desired configuration is achieved. An electronic component is introduced. The electronic component has a characteristic such as compatibility or the like associated with a physical characteristic such as a particular keying structure or lack thereof in the case of a pre-existing configuration. If the component contains a correct characteristic, the component is received. If the component has an incorrect characteristic the component is prevented from being received.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1A is an isometric overview of a system for controlling electronic component configuration;

FIG. 1B is an isometric view of the system for controlling electronic component configuration of FIG. 1A;

FIG. 2A is an isometric view of a plate adjustably connected to a guard, wherein the guard and plate are disposed in a blocked and hidden configuration;

FIG. 2B is an isometric view of a plate adjustably connected to a guard, wherein the guard and plate are disposed in a blocked and hidden configuration;

FIG. 2C is an isometric view of a plate adjustably connected to a guard, wherein the guard and plate are disposed in an open or keyed configuration;

FIG. 2D is an isometric view of a plate adjustably connected to a guard, wherein the guard and plate are disposed in an open or keyed configuration;

FIG. 3A is an isometric view of a plate and guard disposed in a blocked configuration capable of matching/accepting a non-keyed component with a correct characteristic;

FIG. 3B is an isometric view of a plate and a guard disposed in a blocked configuration blocking a keyed component with an incorrect characteristic;

FIG. 3C is an isometric view of a plate and a guard disposed in an open configuration blocking/preventing reception of a non-keyed component with an incorrect characteristic;

FIG. 3D is an isometric view of a plate and guard disposed in an open configuration capable of matching/accepting a keyed component with a correct characteristic; and FIG. 4 is a flow diagram of a method for controlling electronic component configuration.

DETAILED DESCRIPTION OF THE INVENTION

Referring to FIGS. 1A and 1B, a system for controlling electronic component configuration 100 is shown. The system 100 of the present invention controls the addition of electronic components to the device. For example, a chassis 104 employing the system of the present invention may physically lockout components having an unmatched, incompatible or incorrect characteristic, while permitting reception of components with a correct characteristic. The system of the present invention further permits utilization with keyed components designed for utilization with the system and additionally is capable of utilization with unkeyed components. The system of the present invention permits retrofitting with compatible components.

The system 100 for controlling electronic component configuration includes a guard 102. The guard 102 is connected to the chassis 104 for containing electronic device components. The chassis 104 forms a cage for orientating the received components. For example, the chassis 104 contains two data storage controllers 116. The guard 102 forms a stop to at least partially secure the component in the chassis 104. In the present implementation, the storage controllers 116 would be introduced into the chassis 104 inwardly towards the guard 102. The guard 102 and a plate 106, discussed below, are disposed in an open orientation. Thus, the component is properly seated into the chassis, for instance, the electronic connection is properly received for connection with the electronic device employing the chassis 104.

As may be best seen in FIGS. 2B and 2D, the guard 202, of the present embodiment, includes two pins 212 connected to the guard face which are orientated towards the received component when the guard is connected to a chassis, such as the chassis 104 as described with respect to FIG. 1. Those of skill in the art will recognize that the specific form of the pin structure may vary as contemplated herein while the general function of aligning/blocking various parts, such as a when a proper configuration for receiving a component is achieved is substantially similar throughout. The guard pins 212 function generally to permit electronic components with corresponding physical configurations to couple into the associated chassis or prevent the reception of an incompatible component with non-corresponding physical configuration. The component's physical configuration may be associated with a characteristic such as compatibility and the like.

Additionally, the system of the present invention permits implementing electronic components lacking keying structures such as pin/aperture structures. As will be appreciated, the exact configurations of the various structures, such as apertures, and pins included in the system and generally corresponding structures, such as pins and or apertures on received electronic components may allow or prevent the coupling of a component depending on the specific implementation.

A plate 206 is adjustably connected to the guard 202 generally opposite the direction of the guard pins 212. The guard 202 includes guide rails for maintaining the plate 206 in a general orientation, for example to allow the plate to slide between the rails to adjust. The plate 206 includes two apertures 210. The plate apertures 210 in the present embodiment permit connecting the plate 106 via a securing mechanism, such as a rivet, a screw 208 and the like to the guard 202. The plate apertures 210 additionally function to alternatively allow or prohibit pin structures on a received electronic components to mate, thus permitting or preventing the component to be configured into a chassis, such as the chassis 104 as described with respect to FIGS. 1A and 1B.

In the present example, two pins 214 are connected to the plate 206. The plate pins 214 are orientated generally parallel to the plate aperture openings, such that when the plate 106 is orientated with the plate pins 214 towards the guard 202, the plate pins 214 extend through apertures in the guard, such that the plate pins extend beyond the guard. The guard apertures 218 permit entry of the plate pins 214 and of corresponding component pins when the system is orientated in an open configuration, such as disclosed in FIGS. 2C, 2D, and 3D. The plate 206 is adjustably connected to the guard 202, thus the system 200 may adjust to achieve desired configurations.

For example as may be seen in FIGS. 2A, 2B, 3A and 3B the plate 206 and the guard 202 are configured to achieve a blocked configuration. A blocked configuration disposes the plate 206 and the guard 202 such that the arrangement of the plate aperture and the guard aperture prevents component pins from being received into the plate/guard apertures. For example, in FIG. 3A the system 200 is implemented with a pre-existing non-keyed component 216, in this implementation the plate pin is hidden, or outside the component footprint and thus the component may be received. Referring now to FIG. 3B, the system 200 is implemented with a keyed component 217. In this example the guard and plate are arranged in a blocked configuration and the keyed component 217 is blocked, therefore cannot be received. Additionally, the guard pins 212 may be oriented such that components having an incorrect characteristic are block as well.

Referring to FIG. 3D a system 200 for controlling electronic configuration is discussed. In the current implementation the system 200 includes a guard 202 and a plate 206 disposed in an open configuration. The orientation of the guard and plate permits a keyed component 217 having a correct characteristic, for example a component pin 220 and component aperture 222 to be received and thus properly seat into the system 200.

Referring now to FIG. 3A a system 200 for controlling electronic component configuration is shown. In the present implementation the system 200 when implemented with a component 216 with a correct characteristic but lacking keying structures, such as pins/apertures the system permits connection. Permitting reception and seating of a component 216 may be achieved by adjusting the guard 202 and the plate 206 such that the keying structures such as plate pins are disposed beyond the component footprint, thus the pins are out of the way of the component to be received. The present implementation allows components with a correct characteristic but lacking a keying structure to be received into for example, a chassis including the system of the present invention.

Referring to FIG. 3C the guard 202 and a plate 206 included in a system 200 of the present invention are shown interacting with a non-keyed component 216 with an incorrect characteristic, such as having an improper match. The system 200 prevents coupling the unmatched component via a plate pin 214 disposed within the footprint of the component thus preventing seating of the component 216.

Referring to FIG. 4, a method 400 for controlling electronic component configuration is discussed. Initially, a guard and a plate are configured into a desired orientation 402. For example, a system including the guard and plate may be configured to obtain a blocked configuration, or an open configuration as desired by a user. In the present example, a user may slide the plate with respect to the guard to achieve the desired configuration. The guard and the plate are secured in the desired configuration 404, such as by screwing/fastening the plate to the guard.

An electronic component including a characteristic corresponding to a physical characteristic is introduced 406 into a system employing the present method. For example, a component with a correct/compatible characteristic, such as whether the electronic component matches is introduced into a chassis implementing the current method.

If the electronic component has a correct characteristic, such as compatibility the physical structure such as pins/apertures permit the component to be received 408. Receiving 408 includes permitting the component to seat into a chassis. If the electronic component has a compatible characteristic but lacks a keying structure the component is received due to the disposition of plate/guard pins exterior to the footprint of the received component.

If the electronic component has an incorrect characteristic the component is prevented 410 from being received. For example, if the introduced component fails to match another component the introduced component is prevented from seating. The introduced component may either be prevented by pin/aperture structures.

Further, it is understood that the specific order or hierarchy of steps in the methods disclosed are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the selectable keying device of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A system for controlling electronic component configuration, comprising:
    a plate including a plate aperture;
    a first pin connected to the plate, said first pin orientated generally parallel with the plate aperture;
    a guard connected to the plate, the guard including a guard slot suitable for adjustably receiving said first pin;
    a second pin connected to the guard, said second pin orientated generally parallel with the guard slot; and
    a securing mechanism connecting the plate and the guard, for securing the plate to the guard;
    wherein the plate and the guard are capable of obtaining a blocked configuration and an open configuration for controlling electronic component reception.

2. The system of claim 1, further comprising a chassis connected to the guard, for containing received electronic components.

3. The system of claim 1, wherein the system is configured for accepting a storage system device.

4. The system of claim 2, wherein the chassis includes a cage for orientating received components.

5. The system of claim 1, wherein the system in the open configuration is capable of receiving a component with a correct characteristic.

6. The system of claim 1, wherein the system in the open configuration is capable of receiving an un-keyed component with a correct characteristic.

7. The system of claim 1, wherein the system in the open configuration is capable of receiving a keyed component with a correct characteristic.

8. The system of claim 1, wherein the orientation of at least one of the first pin, the second pin, guard slot, or plate aperture prevents coupling an electronic component with an incorrect characteristic.

9. An adjustable system for controlling electronic component configuration, comprising:
    a chassis, suitable for containing received electronic components;
    a guard including a guard aperture therein, connected to the chassis for positioning received components;
    a plate including a plate aperture, movably connected to the guard;
    a first pin connected to the plate, said first pin orientated through the guard aperture;
    a second pin connected to the guard, said second pin orientated generally opposite the plate; and
    a securing mechanism connecting the plate and the guard, for securing the plate to the guard;
    wherein the plate and the guard are capable of obtaining a blocked configuration and an open configuration for controlling electronic component reception.

10. The adjustable system of claim 9, wherein the electronic component is a storage system device.

11. The adjustable system of claim 9, wherein the adjustable system in the open configuration is capable of receiving a component with a correct characteristic.

12. The adjustable system of claim 9, wherein the orientation of at least one of the first pin, the second pin, guard aperture, and plate aperture prevents coupling an electronic component with an incorrect characteristic.

13. The adjustable system of claim 9, wherein the system in the open configuration is capable of receiving an un-keyed component with correct characteristic.

14. The adjustable system of claim 9, wherein the system in the open configuration is capable of receiving a keyed component with a correct characteristic.

* * * * *